United States Patent
Lee et al.

(10) Patent No.: US 10,651,218 B1
(45) Date of Patent: May 12, 2020

(54) OPTICAL SENSOR STRUCTURE AND METHOD FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Hsueh-Jung Lin, Zhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/239,080

(22) Filed: Jan. 3, 2019

(51) Int. Cl.
*H01L 27/146* (2006.01)
*H01L 23/48* (2006.01)

(52) U.S. Cl.
CPC ...... *H01L 27/14625* (2013.01); *H01L 23/481* (2013.01); *H01L 27/14623* (2013.01); *H01L 27/14636* (2013.01); *H01L 27/14685* (2013.01)

(58) Field of Classification Search
None
See application file for complete search history.

(56) References Cited

U.S. PATENT DOCUMENTS

| 8,946,742 B2 * | 2/2015 | Yu | H01L 33/644 257/98 |
| 2018/0278869 A1 | 9/2018 | Fan | |
| 2019/0286869 A1 * | 9/2019 | Ling | G06F 3/0421 |

FOREIGN PATENT DOCUMENTS

| TW | 200834044 A | 8/2008 |
| TW | 201135896 A1 | 10/2011 |
| TW | 201337014 A | 9/2013 |
| TW | 201812356 | * 9/2016 |
| TW | 201812356 A | 4/2018 |

OTHER PUBLICATIONS

Taiwanese Office Action and Search Report for Taiwanese Application No. 107138601, dated Sep. 5, 2019.

* cited by examiner

*Primary Examiner* — Zandra V Smith
*Assistant Examiner* — Andre C Stevenson
(74) *Attorney, Agent, or Firm* — Birch, Stewart, Kolasch & Birch, LLP

(57) ABSTRACT

An optical sensor structure is provided. The optical sensor structure includes a sensor pixel array in a substrate, a light collimating layer on the substrate, and at least one through-substrate via. The sensor pixel array has a plurality of sensor pixels. The at least one through-substrate via extends from a first surface to an opposite second surface of the substrate. The at least one through-substrate via is in the sensor pixel array and vertically misaligned with the plurality of sensor pixels.

20 Claims, 6 Drawing Sheets

OPTICAL SENSOR STRUCTURE AND METHOD FOR FORMING THE SAME

BACKGROUND

Technical Field

The present disclosure relates to a sensor structure, and in particular, it relates to an optical sensor structure and a method for forming the same.

Description of the Related Art

Current mobile electronic devices such as cellphones, tablets, and notebooks are usually equipped with user identification systems for protecting personal information. Fingerprint sensing is a common and reliable user identification system because everyone's fingerprints are different.

Conventional fingerprint sensors usually rely on optical technologies to detect the fingerprints of a user. Optical elements of the fingerprint sensors which are based on optical technologies may include a light collimator, a beam splitter, a focusing lens, and a linear sensor, wherein the light collimator is utilized to ensure that light which is incident to the sensor is parallel, to reduce energy loss from divergent light.

In traditional manufacturing processes, metal wires are routed through various structural layers in order to connect fingerprint sensor with other devices. This can cause the volume to increase, the signal to decay, and the cost to increase.

While existing optical fingerprint sensors have been generally adequate for their intended purposes, they have not been satisfactory in all respects. There is a particular need for further improvements in the connection technique for the fingerprint sensors and other devices.

BRIEF SUMMARY OF THE DISCLOSURE

Some embodiments of the disclosure provide an optical sensor structure. The optical sensor structure includes a sensor pixel array in a substrate, a light collimating layer on the substrate, and at least one through-substrate via. The sensor pixel array has a plurality of sensor pixels. The at least one through-substrate via extends from a first surface to an opposite second surface of the substrate. The at least one through-substrate via is in the sensor pixel array and does not vertically overlap with the plurality of sensor pixels.

Some embodiments of the disclosure provide a method for manufacturing an optical sensor structure. The method includes forming at least one through-substrate via in a substrate, forming a sensor pixel array in the substrate, and forming a light collimating layer on the substrate. The sensor pixel array has a plurality of sensor pixels, and the at least one through-substrate via is in the sensor pixel array and does not vertically overlap with the plurality of sensor pixels.

A detailed description is given in the following embodiments with reference to the accompanying drawings.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
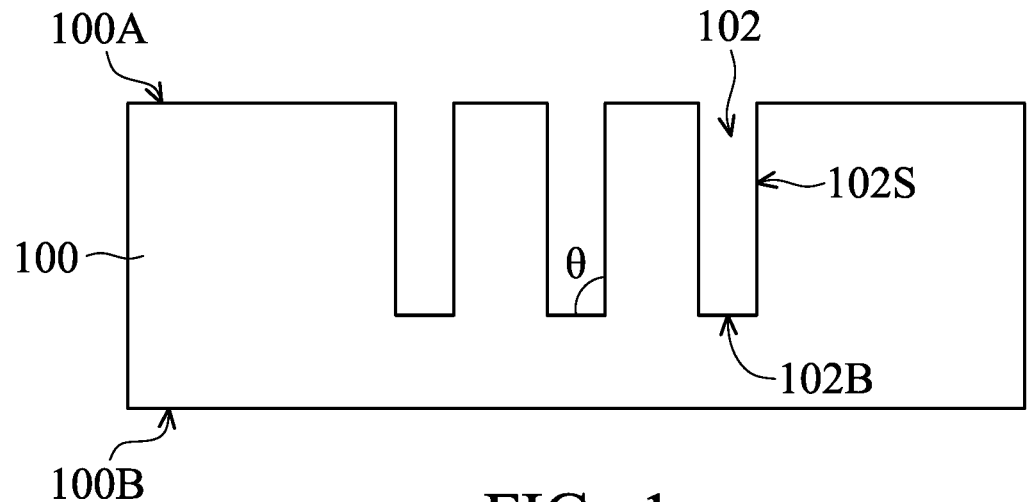
FIGS. 1-7, 8A, 8B, 9, and 10 are cross-sectional views illustrating a method for manufacturing an optical sensor structure in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

An optical sensor structure and a method for forming the same of embodiments of the present disclosure are described in the following description. This description is made for the purpose of illustrating the general principles of the disclosure and should not be taken in a limiting sense. These are, of course, merely examples and are not intended to be limited. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

An exemplary embodiment of the present disclosure provides an optical sensor structure and a method for forming the same, especially an optical sensor structure including a light collimating layer, which utilizes a through-substrate via (TSV) under the light collimating layer to vertically conduct the stacked devices, and the ways in which the signals are transmitted have been changed from horizontally to vertically. As a result, the device can have an increased stacking density, a decreased volume, and an improved electrical performance. Moreover, since it is unnecessary to form metal wires, molding compound, and package substrate for encapsulation, a structure thickness can be further decreased, and the defect resulted from thermal expansion coefficient mismatch can be reduced.

In addition, a region of the sensor pixel array where no sensor pixel is disposed is further utilized to dispose one or more through-substrate via(s) in accordance with some embodiments of the present disclosure. Disposing the through-substrate via(s) in the sensor pixel array may further reduce the volume of the optical sensor structure as compare to disposing the through-substrate via(s) in the periphery region of the sensor pixel array, and thus a die gain of a substrate may be increased.

Figure 8A:
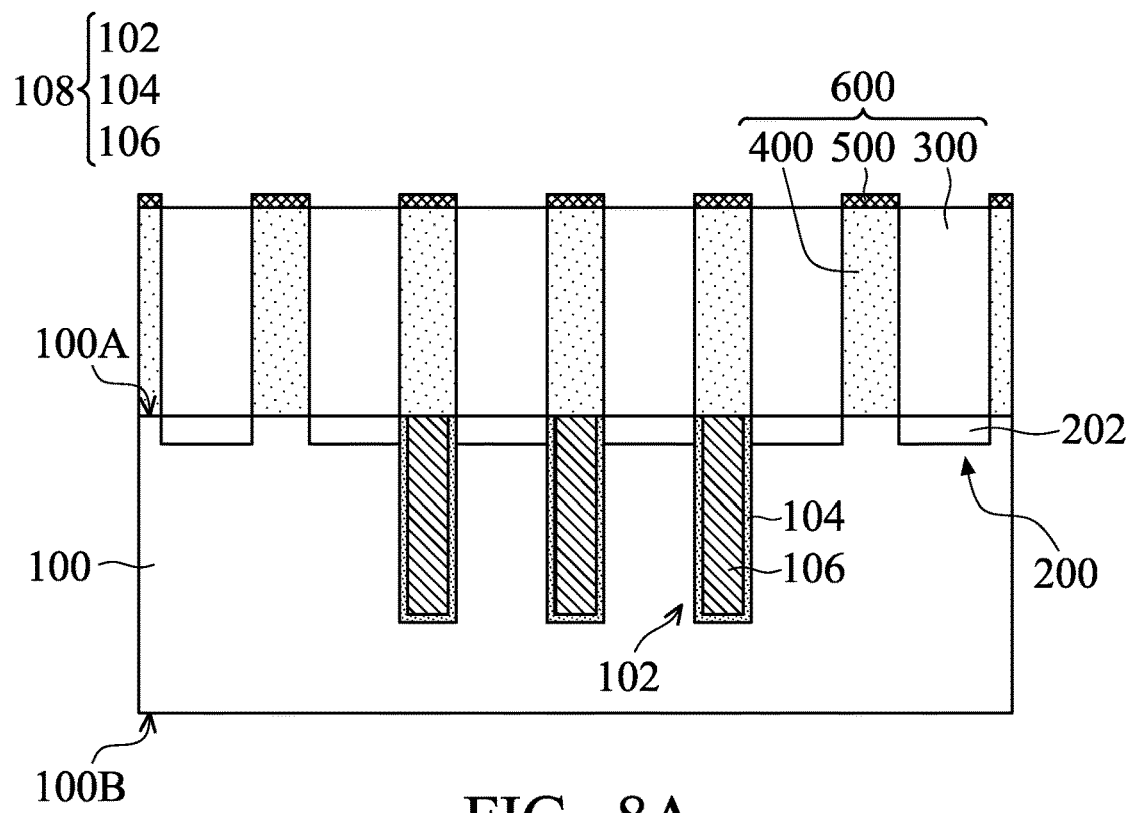
Figure 8B:
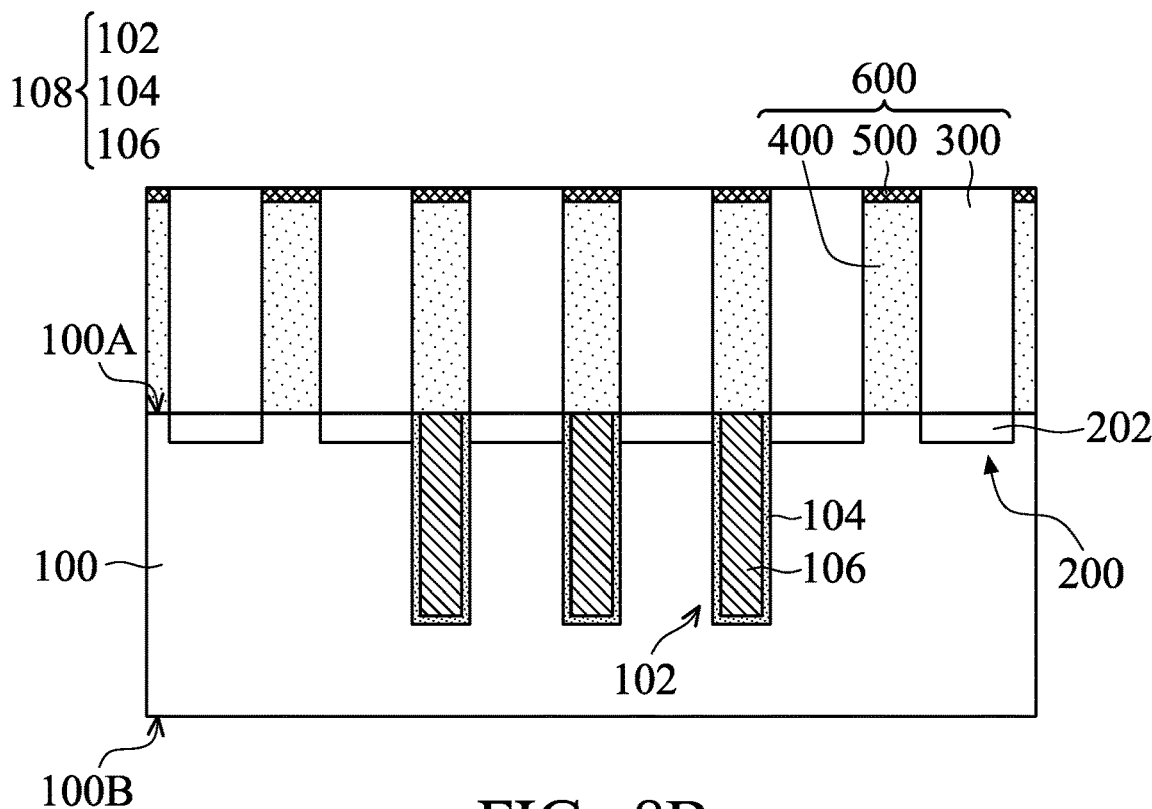
Figure 9:
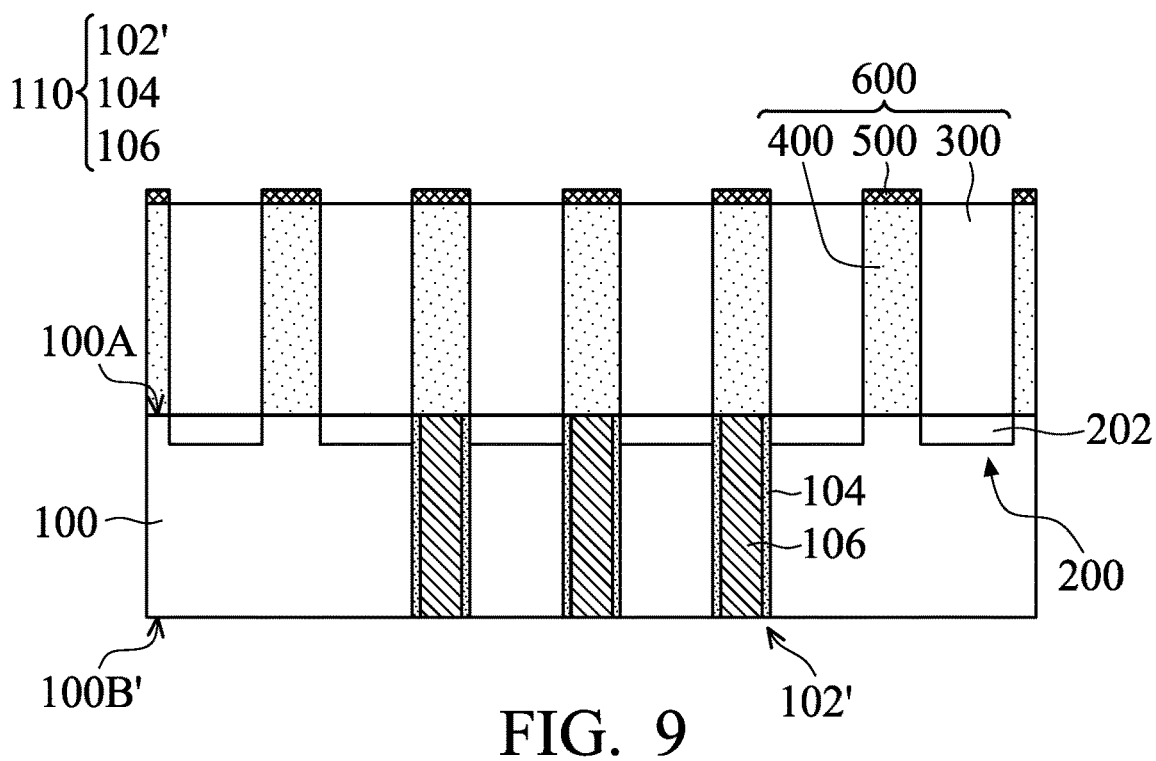
Figure 10:
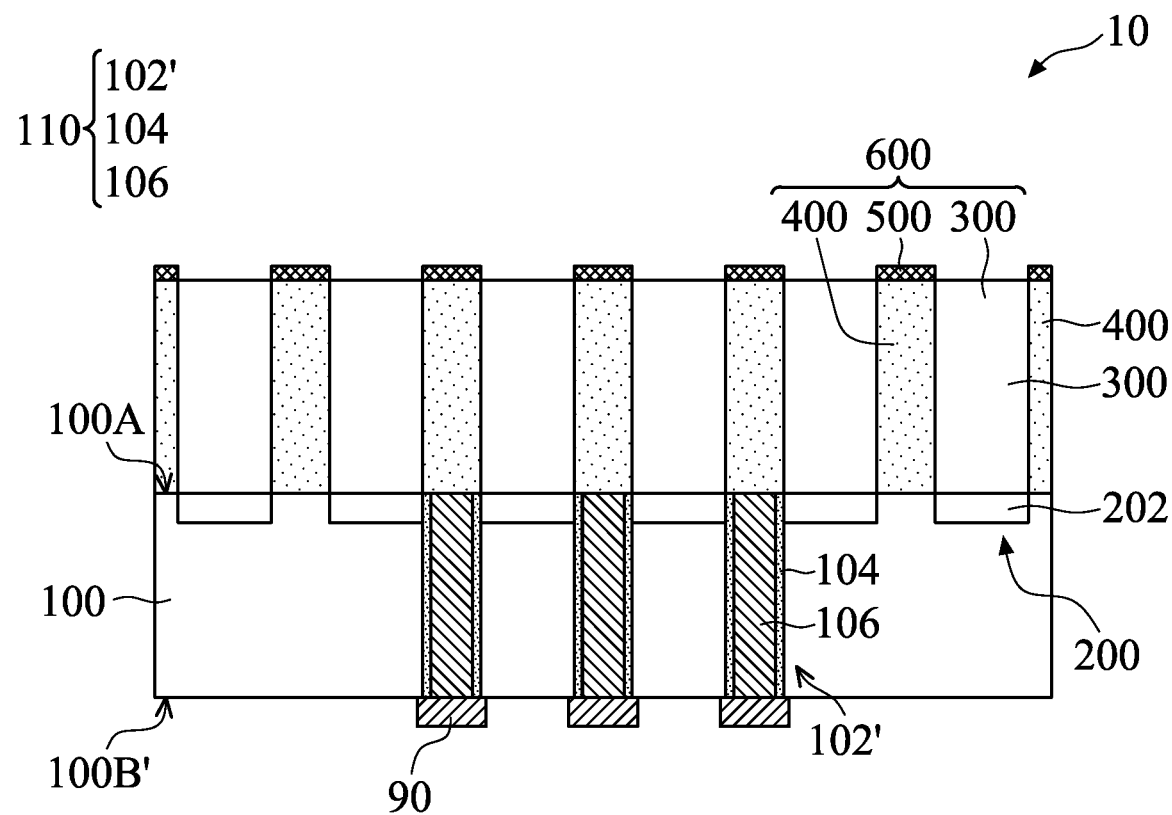

FIGS. 1-7, 8A, 8B, 9, and 10 are cross-sectional views illustrating various stages of a process for forming an optical sensor structure 10 of FIG. 10 in accordance with some embodiments of the present disclosure.

First referring to FIG. 1, in some embodiments, a substrate 100 is provided, and the substrate 100 has holes 102. In the embodiment, the substrate 100 may be a silicon substrate, a silicon germanium (SiGe) substrate, a compound semiconductor, a bulk semiconductor substrate, a silicon-on-insulator (SOI) substrate or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor including silicon (Si) or germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

In some embodiments, the substrate 100 may include various isolation features (not shown) to define an active region and electronically isolate active elements in or on the substrate 300. In some embodiments, examples of the isolation features include shallow trench isolation (STI) features, local oxidation of silicon (LOCOS) features, other suitable isolation features, or a combination thereof.

Continuing to refer to FIG. 1, the holes 102 are located in a predetermined region of a sensor pixel array 200 (please see FIG. 5) to be formed, and the holes 102 will be formed to be through-substrate vias 110 in the subsequent processes (please see FIG. 9) so as to connects the optical sensor structure 10 with other devices. The hole 102 extends from a top surface 100A of the substrate 100 toward a bottom surface 100B of the substrate 100, but not extends to the bottom surface 100B of the substrate 100. Although the substrate 100 has three holes 102 in the illustrated embodiment, embodiments of the disclosure are not limited thereto. The substrate 100 may have more or less holes 102 depending on the practical design requirement, for example, one hole 102. In some embodiments, an angle θ may be included between a sidewall 102S of the hole 102 and a bottom surface 102B of the hole 102, the angle θ is in a range from about 90 degrees to about 130 degrees. For example, the angle θ may be 90 degree (that is, the hole 102 has a vertical sidewall), or may be 92 degree (that is, the hole 102 has an inclined sidewall). In some embodiments, a depth of the hole 102 is in a range from about 25 micrometers (um) to about 300 um, such as 100 um. In some embodiments, a diameter of the hole 102 is in a range from about 10 um to about 150 um, such as 50 um. In some embodiments, an aspect ratio of the hole 102 is in a range from about 1 to about 20. The hole 102 may be formed by appropriate processes, such as lithography and etching processes.

Figure 2:
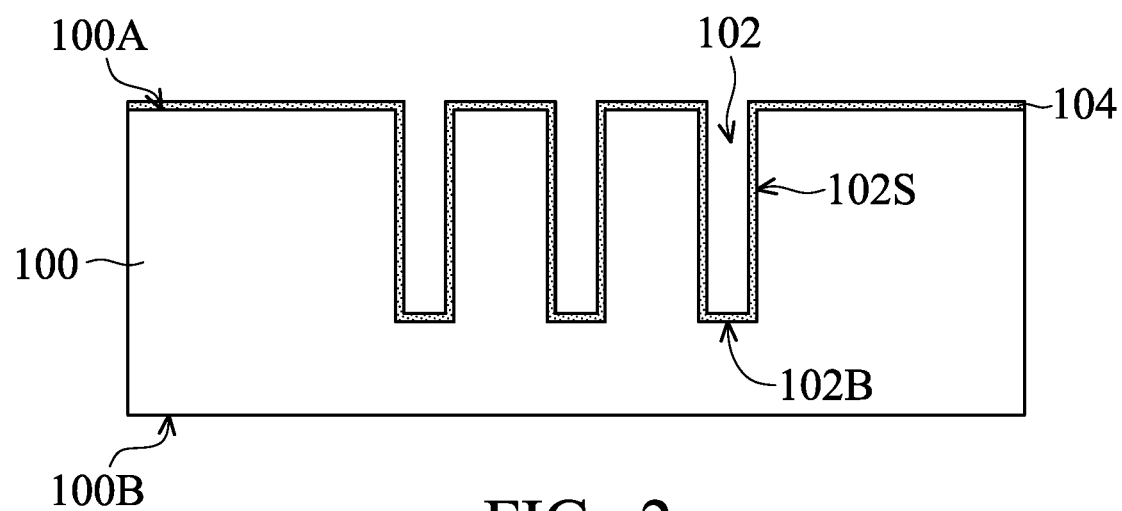
Figure 3:
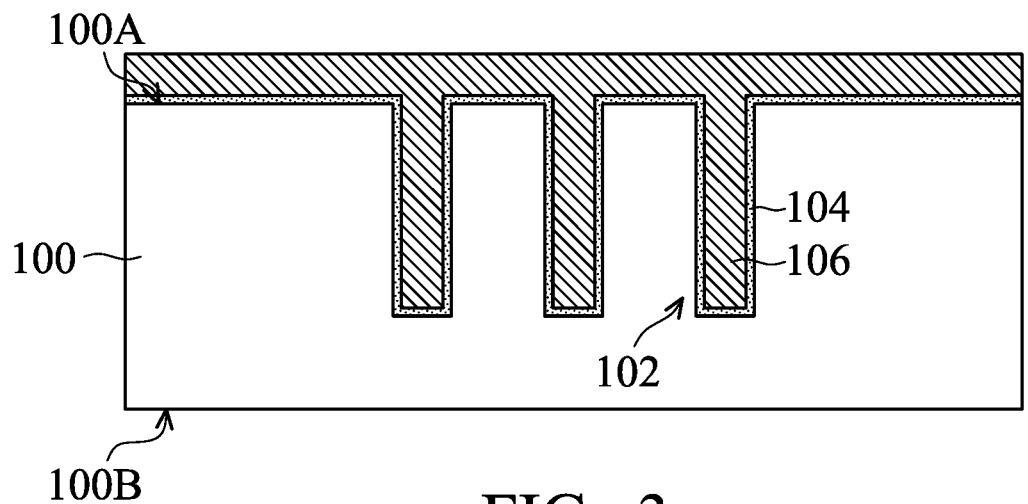

Please refer to FIG. 2, in accordance with some embodiments, a seed layer 104 may be formed conformally on the sidewalls 102S and the bottom surfaces 102B of the holes 102 and on the top surface 100A of the substrate 100. The seed layer 104 may be used to form a conductive layer 106 (as shown in FIG. 3) in the subsequent processes (for example, an electrode plating process). In some embodiments, the material of the seed layer 104 may be a conductive material, such as copper (Cu), tungsten (W), aluminum (Al), the like, or a combination thereof. In some embodiments, the seed layer 104 may be formed by a chemical vapor deposition (CVD) process, an atomic layer deposition (ALD), a physical vapor deposition (PVD) process, another applicable process, or a combination thereof. In some embodiments, the thickness of the seed layer 104 which is formed by the process mentioned above is in a range from about 0.1 um to about 3 um.

Figure 4:
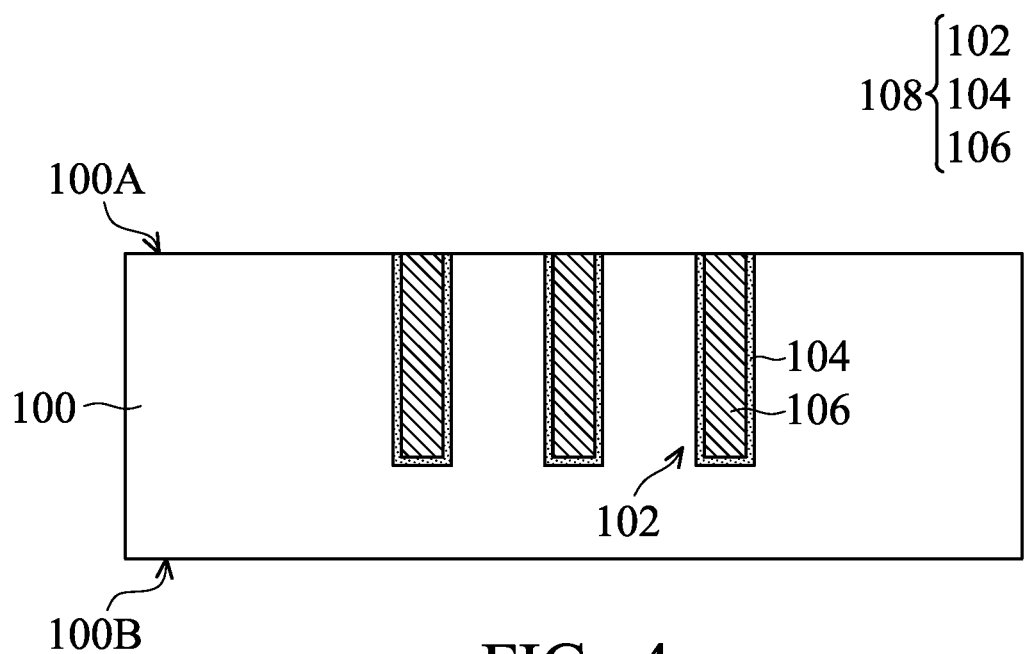

Please refer to FIG. 3, in accordance with some embodiments, after forming the seed layer 104, the conductive layer 106 may be formed in the holes 102 and on the top surface 100A of the substrate 100 by the electrode plating process. In the subsequent processes, the hole 102, the seed layer 104, and the conductive layer 106 will together construct as a via hole 108 (as shown in FIG. 4). In some embodiments, the conductive layer 106 may include metal or another applicable conductive material, such as tungsten (W), copper (Cu), nickel (Ni), aluminum (Al), polysilicon, or a combination thereof.

FIG. 4 illustrates the formation of the via hole 108. In some embodiments, performing a planarization process on the top surface 100A of the substrate 100 to remove excess portions of the seed layer 104 and conductive layer 106 outside the holes 102, and expose the top surface 100A of the substrate 100. In some embodiments, the planarization process may include chemical mechanical polishing (CMP) process, grinding process, etching process, another applicable process, or a combination thereof.

Figure 5:
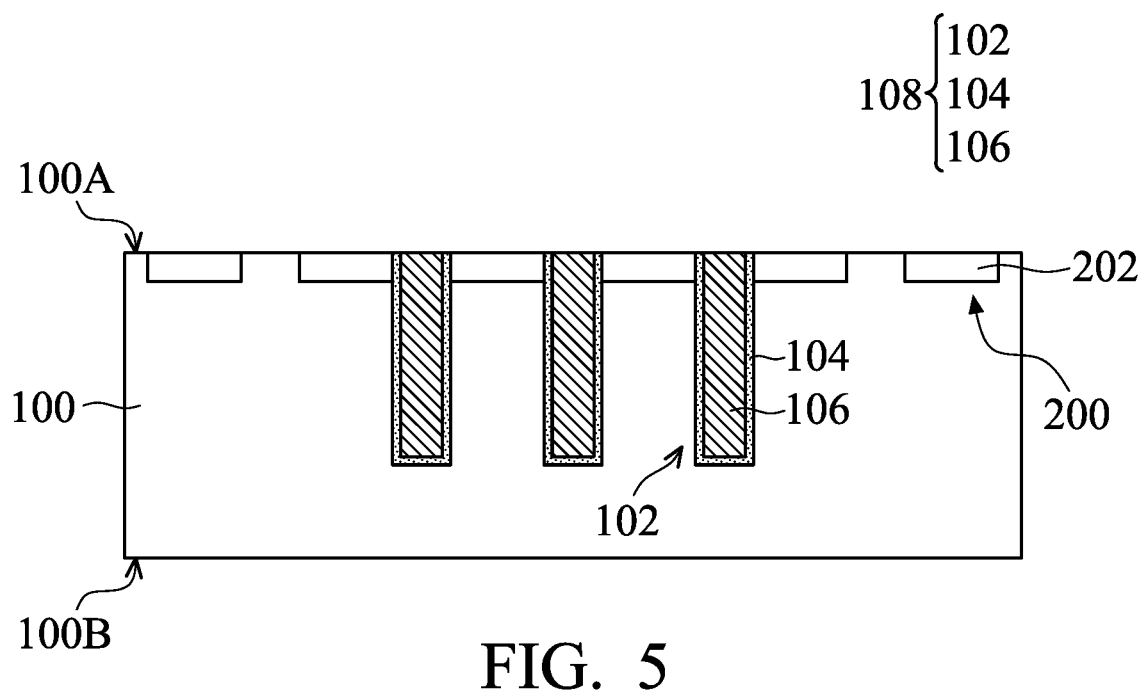

Please refer to FIG. 5, in some embodiments, a sensor pixel array 200 is formed in the substrate 100, wherein the sensor pixel array 100 has a plurality of sensor pixels 202. In some embodiments, the substrate 100 may include various device elements. The device elements are not illustrated for the purpose of simplicity and clarity. The device elements may include transistors, diodes, other applicable elements, or a combination thereof. For example, the transistors may be metal oxide semiconductor field effect transistors (MOSEFT), complementary metal oxide semiconductors (CMOS), bipolar junction transistors (BJT), high voltage transistors, high-frequency transistors, p-channel and/or n channel field effect transistors (PFETs/NFETs), and the like.

In some embodiments, the substrate 100 may include various conductive features, such as a conductive line or a via (not shown). For example, the conductive features may be made of aluminum (Al), copper (Cu), tungsten (W), another applicable conductive material, an alloy thereof, or a combination thereof.

Continuing to refer to FIG. 5, the via holes 108 are in the sensor pixel array 200 and do not vertically overlap with the plurality of sensor pixels 202. In some embodiments, the plurality of sensor pixels 202 may connect signal processing circuitry (not shown). In some embodiments, the number of sensor pixels 202 included in the sensor pixel array 200 depends on the size of the area of the optical sensing region. Each of the sensor pixels 202 may include one or more photodetectors. In some embodiments, the photodetector may include photodiodes, wherein the photodiodes may include a photoelectric material made of a sandwich structure composed of a P-type semiconductor layer, an intrinsic layer, and an N-type semiconductor layer. In the sandwich structure, the intrinsic layer receives light to produce excitons, and the excitons decompose into electrons and holes at a junction between the P-type semiconductor layer and the N-type semiconductor layer to produce current signals. In other embodiments, the photodetector may also include a charged coupling device (CCD) sensor, a complimentary metal-oxide-semiconductor (CMOS) image sensor, an active sensor, a passive sensor, other suitable sensors, or a combination thereof. In some embodiments, the plurality of sensor pixels 202 may transform the received optical signals into electronic signals through a photodetector, and process the electronic signals through the signal processing circuitry.

In some embodiments, as shown in a cross-sectional view in FIG. 5, the sensor pixels 202 of the sensor pixel array 200 are disposed in the top surface 100A of the substrate 100, and are misaligned with the via holes 108. It should be noted that the number and arrangement of the sensor pixel array 200 are merely exemplary, and the present disclosure is not limited thereto. The plurality of sensor pixels 202 may be formed into an array with any number of rows, or in any other arrangement.

The region of the sensor pixel array 200 where no sensor pixel 202 is disposed may be fully utilized by the way of arranging the via holes 108 and sensor pixels 202 vertically misaligned and not vertically overlapped, so as to dispose through-substrate vias (to be formed in the subsequent process) in the sensor pixel array 200. Disposing the through-substrate via(s) in the sensor pixel array may further reduce the volume of the optical sensor structure as compare to disposing the through-substrate via(s) in the periphery region of the sensor pixel array, and thus a die gain of the substrate may be increased.

Figure 6:
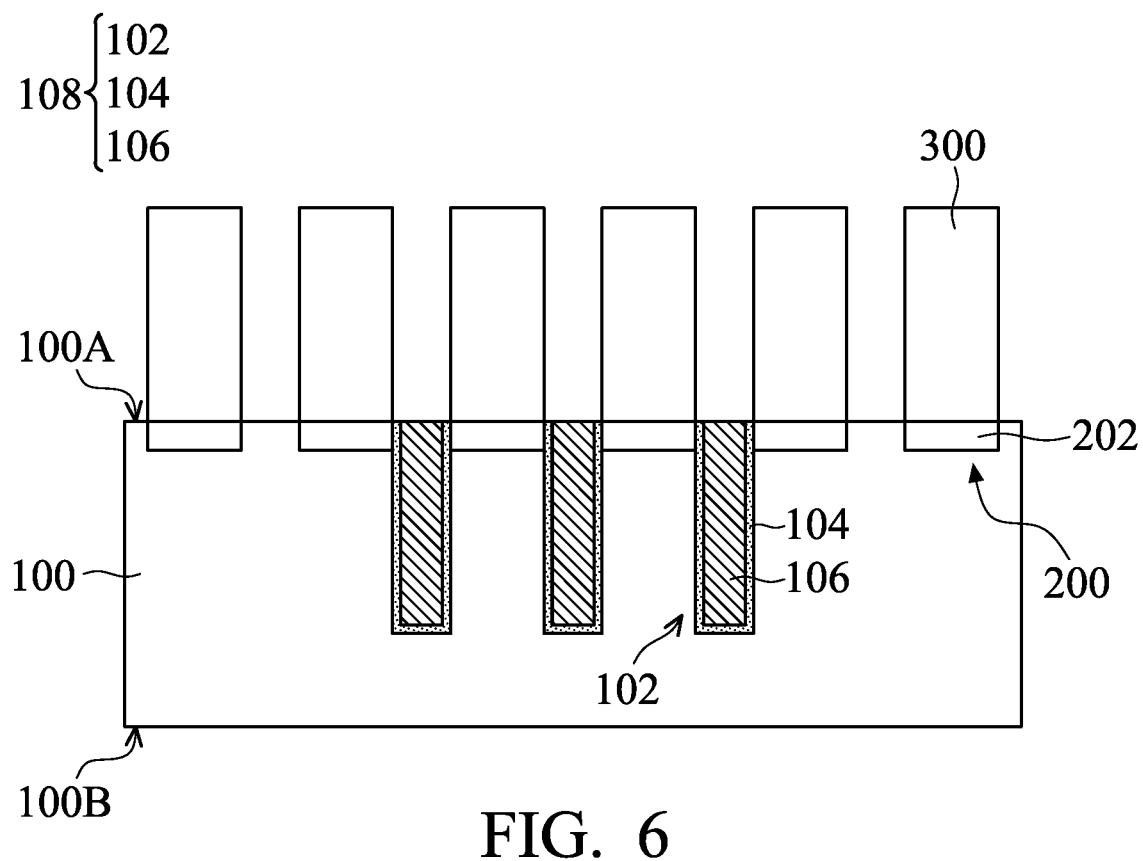

Please refer to FIG. 6, a plurality of transparent pillars 300 is formed. Each of the transparent pillars 300 is disposed on each of the sensor pixels 202 of the sensor pixel array 200 correspondingly. In some embodiments, a transparent layer (not shown) may be blanketly formed on the substrate 100 to cover the sensor pixel array 200. In some embodiments, the transparent layer may include a transparent material, wherein the light transmittance of the transparent material to light with a wavelength in a range from 300 nm to 1200 nm is greater than 90%, and thereby portions of incident lights are allowed to pass through the transparent layer to reach the plurality of sensor pixels 202.

In some embodiments, the transparent layer may include UV-curable materials, thermosetting materials, or a combination thereof. For example, the transparent material may include polymethyl methacrylate (PMMA), polyethylene terephthalate (PET), polyethylene naphthalate (PEN), polycarbonate (PC), perfluorocyclobutyl (PFCB) polymer, polyimide (PI), acrylic resins, epoxy resins, polypropylene (PP), polyethylene (PE), polystyrene (PS), polyvinyl chloride (PVC), another applicable material, or a combination thereof. In some embodiments, the transparent layer may be formed on the substrate 100 through a process such as spin-coating, casting, bar coating, blade coating, roller coating, wire bar coating, dip coating, chemical vapor deposition, other suitable processes, or a combination thereof. In some embodiments, the thickness of the transparent layer formed by the process above is in a range from about 10 micrometers (um) to about 300 um, such as 100 um. In other embodiments, the thickness of the transparent layer is in a range from about 100 um to about 500 um, such as 300 um.

Next, as shown in FIG. 6, the transparent layer formed on the substrate 100 is selectively removed. In some embodiments, since the transparent pillars 300 are disposed respectively on the sensor pixels 202, the transparent pillars 300 and the via holes 108 are not vertically overlapped as well in a cross-sectional view. In other words, the transparent pillars 300 are vertically misaligned with the via holes 108. In some embodiments, the transparent pillars 300 can protect the sensor pixels 202 and reduce or prevent contamination or damage to the sensor pixels 202 during the manufacturing process, which may further the sensitivity of the optical sensor structure 10. In some embodiments, each of the transparent pillars 300 is disposed on each of the sensor pixels 202 correspondingly, as shown in FIG. 6. In other embodiments, at least one of the transparent pillars 300 is disposed on two or more sensor pixels 202 (not shown). In some embodiments, the shape of each of the transparent pillars 300 may be a circle, rectangle, polygon, or a combination thereof and arranged into an array from a top view (not shown).

In some embodiments, the transparent layer may be selectively removed by performing a patterning process to form the transparent pillars 300. In some embodiments where the material of the transparent layer is a non-photoresist material, the patterning process may include a lithography process and an etching process. The lithography process may include photoresist coating (e.g., spin-coating), soft baking, exposure, post-exposure baking, photoresist developing, rinsing and drying (e.g., hard baking), other suitable processes, or a combination thereof. The etching process may include such as a wet etching process, a dry etching process (e.g., reactive ion etch (RIE), plasma etching, or ion milling), other suitable processes, or a combination thereof.

In other embodiments, the material of the transparent layer may be a photoresist material. In such cases, the transparent layer may be patterned directly through a lithography process to form the patterned transparent pillars 300 without an additional etching process. The lithography process is similar to the lithography process mentioned above, and therefore are not repeated here.

In some embodiments, the thickness of the transparent pillars 300 which are formed by the process mentioned above is in a range from about 10 um to about 300 um, such as 100 nm. In other embodiments, the thickness of the transparent pillars 300 is in a range from about 100 um to about 500 um, such as 300 nm.

Figure 7:
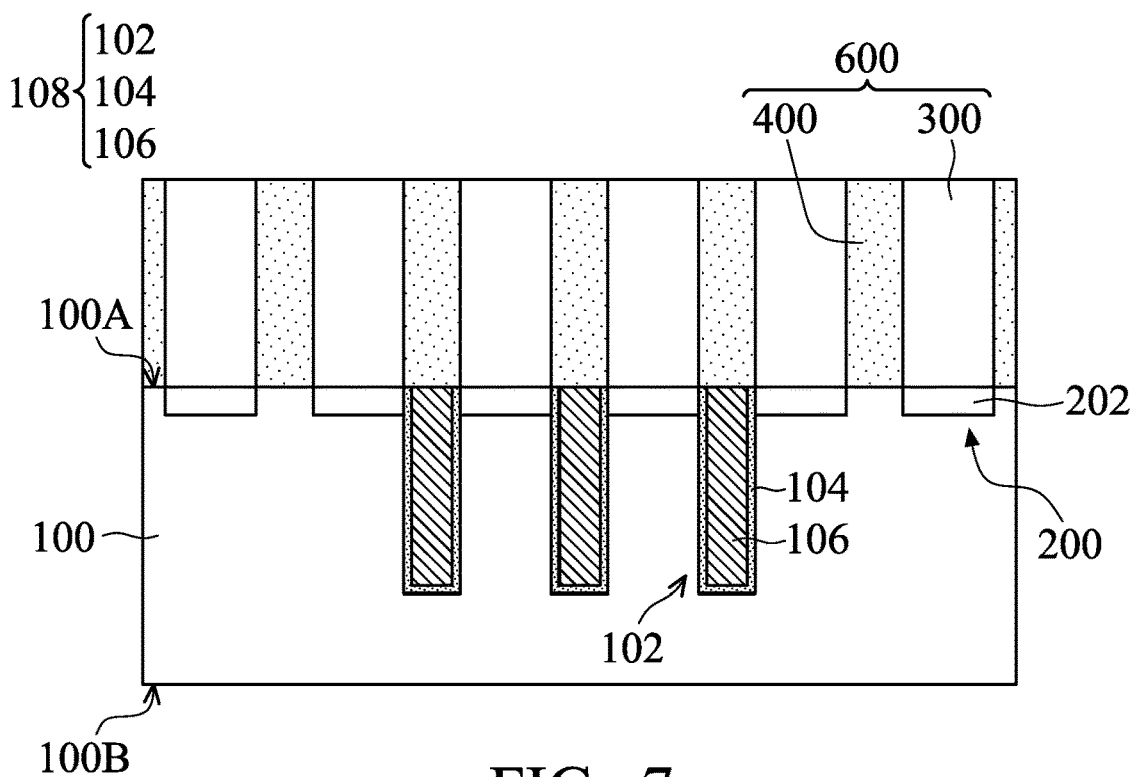

Next, referring to FIG. 7, a light shielding layer 400 is formed on the substrate 100, and the light shielding layer 400 fills the spaces in between the transparent pillars 300. In some embodiments, the light shielding layer 400 may include photoresist (for example, black photoresist or another applicable non-transparent photoresist), oil ink (for example, black oil ink or another applicable non-transparent oil ink), molding compound (for example, black molding compound or another applicable non-transparent molding compound), solder mask (for example, black solder mask or another applicable non-transparent solder mask), another applicable materials, or a combination thereof.

In some embodiments, the light shielding layer 400 may be a UV-curable material, a thermosetting material, or a combination thereof. In this embodiment, a light shielding material (not shown) may be disposed on the substrate 100, and the light shielding material fills the spaces in between the transparent pillars 300. Then, a curing process is performed to cure the light shielding material, so as to form the light shielding layer 400. For example, the curing process may be a UV-curing process, a thermosetting process, or a combination thereof.

In other embodiments, the light shielding layer 400 may include metallic materials. In some embodiments where the light shielding layer 400 includes metallic materials, a seed layer (not shown) including metallic materials may be deposited on the substrate 100 before forming the transparent pillars 300. Then, the seed layer is patterned to expose the sensor pixels 202 on the substrate 100 while the seed layer on the via holes 108 remains. In a top view, the shape of the patterned seed layer and the shape of the sensor pixels 202 are complementary (not shown). After the transparent pillars 300 are formed, an electrode plating process is performed to form the light shielding layer 400 filling the spaces in between the transparent pillars 300, as shown in FIG. 7. In some embodiments, the thickness of the light shielding layer 400 which are formed by the electrode plating process or another applicable process may be higher than, equal to, or lower than the transparent pillars 300. In some embodiments, the light shielding layer 400 may include copper (Cu), nickel (Ni), another applicable metallic material, or a combination thereof.

Moreover, in some embodiments where the light shielding layer 400 includes metallic materials, a light shielding cap 500 may be additionally formed on the light shielding layer 400. In such embodiments, the light shielding cap 500 may include light shielding materials, such as a resin light shielding material, wherein the light transmittance of the light shielding material to light with a wavelength in a range from 300 nm to 1200 nm is less than 1%. The light shielding material may include a UV-curable material, a thermosetting material, or a combination thereof. In some embodiments, the light shielding cap 500 formed on the light shielding layer 400 can prevent the sensor pixels 202 from receiving unwanted light and the crosstalk produced from light that is incident to the optical sensor structure 10. This may further enhance the performance of the optical sensor structure 10.

In some embodiments, the light shielding material may be formed on the light shielding layer 400 through a process such as spin-coating, chemical vapor deposition, other suitable processes or a combination thereof. A curing process such as a UV-curing process, a thermosetting process, or a combination thereof may be performed to cure the light shielding material. Then, a patterning process may be performed to form the light shielding cap 500 on the light shielding layer 400. The patterned light shielding cap 500 only covers the light shielding layer 400 and does not cover the transparent pillars 300. In some embodiments, the thickness of the light shielding cap 500 is in a range from about 0 nm to about 500 nm, such as 100 nm. In other embodiments, the thickness of the light shielding cap 500 is in a range from about 10 nm to about 500 nm, such as 200 um.

In some embodiments, the light shielding material may include non-transparent carbon black, oil ink, molding compound, solder mask, another applicable material, or a combination thereof. In such cases, the patterning process may include a lithography process and an etching process. The lithography process and the etching process may be similar to the embodiment where the transparent pillars are formed by using the non-photoresist material in FIG. 6, and therefore are not repeated here.

In other embodiments, the light shielding material may include a non-transparent photoresist material. In such cases, similar to the embodiment where the transparent pillars are formed by using the non-photoresist material in FIG. 6, a material of light shielding cap is patterned directly to form the light shielding cap 500 on the light shielding layer 400 without an additional etching process.

In some embodiments, before forming the light shielding cap 500 on the light shielding layer 400, a planarization process (e.g., a CMP process) may be performed to planarize the light shielding layer 400 so that the light shielding layer 400 is level with the top surface of the transparent pillars 300. Then, in the above embodiments, the top surface of the light shielding cap 500 on the light shielding layer 400 after the planarization process is slightly higher than the top surface of the transparent pillars 300, as shown in FIG. 8A. For example, the top surface of the light shielding cap 500 on the light shielding layer 400 is about 10 nm higher than the top surface of the transparent pillars 300.

In other embodiments, by controlling the duration of the electrode plating process, the top surface of the light shielding layer 400 formed on the patterned seed layer can be slightly lower than the top surface of the transparent pillars 300. For example, the top surface of the light shielding layer 400 is about 10 nm to about 10 um lower than the top surface of the transparent pillars 300. Then, the light shielding cap 500 is formed on the top surfaces of the light shielding layer 400 and the transparent pillars 300 so that the top surface of the light shielding cap 500 is slightly higher than the top surface of the transparent pillars 300. For example, the top surface of the light shielding cap 500 is about 10 nm higher than the top surface of the transparent pillars 300. After that, a planarization process (e.g., a CMP process) may be performed to planarize the light shielding cap 500 so that the light shielding cap 500 is level with the top surface of the transparent pillars 300, as shown in FIG. 8B.

According to some embodiments of the present disclosure, a combination of the transparent pillars disposed on the sensor pixels 202, the light shielding layer 400 filling the spaces in between the transparent pillars 300, and the light shielding cap 500 (if formed) disposed on the light shielding layer 400 respectively together construct as a light collimating layer 600. The function of the light collimating layer is to collimate light, to reduce the energy loss resulted from light divergence. In some embodiments, other optical elements may be included on the light collimating layer, such as a color filter, a glass, a lens, and the like (not shown). In some embodiments, the incident lights pass through the optical elements on the light collimating layer 600 and are guided to the plurality of sensor pixels 202 through the light collimating layer 600. The aspect ratio of the transparent pillars 300 is in a range from 2 to 30, which may be 5, 10, 15, or 20. If the transparent pillars 300 are too high (i.e., the aspect ratio is too large), the transparent pillars 300 are prone to deformation and collapse, making the manufacturing process more difficult and increasing the cost of the process. If the transparent pillars 300 are too wide (i.e., the aspect ratio is too small), the optical sensor structure 10 is prone to receiving unwanted incident lights, making it difficult to achieve a good collimating performance and reducing the sensitivity of the optical sensor structure 10.

In some embodiments, a cover layer (not shown) is disposed on the light collimating layer. The cover layer may be a hard transparent material, such as calcium aluminosilicate glass, soda lime glass, sapphire, transparent polymers, or other suitable materials, so that at least a portion of the incident light can pass through the cover layer and reach the sensor pixels 202. Furthermore, the hard cover layer can protect the optical sensor structure 10 or other elements under the hard cover layer.

The following description of the process for forming the optical sensing structure 10 is continued with the structure of FIG. 8B. It should be note that the optical sensing structure 10 can also be formed by using the structure of FIG. 7 or FIG. 8A. Next, referring to FIG. 9, in some embodiments, a backside thinning process is performed on the bottom surface 100B of the substrate 100 to form through-substrate vias 110 penetrating through the substrate 100. Each of the through-substrate via 110 has a through hole 102' extending from a first surface 100a (also referred to as the top surface 100A) to an opposite second surface 100B' of the substrate 100. Moreover, the seed layer 104 disposed in the through hole 102' and between the conductive layer 106 and the substrate 100. In some embodiments, the backside thinning process is performed until the conductive layer 106 is exposed to remove a portion of the seed layer 104 under the conductive layer 106, as shown in FIG. 9. In some other embodiments, the backside thinning process is performed until the seed layer 104 is exposed, so that a portion of the seed layer 104 is under the conductive layer 106 (not shown). A combination of the through hole 102', the seed layer 104, and the conductive layer 106 together construct as the through-substrate via 110. A bottom surface of the through-substrate vias 110 is level with the second surface 100B' of the substrate 100.

Please refer to FIG. 10, in some embodiments, after performing the backside thinning process, conductive features 90 may be formed on the second surface 100B' of the substrate 100, and the conductive features 90 connect with the respective through-substrate vias 110 to form the optical sensor structure 10. The optical sensor structure 10 may electrically connect to other devices by the respective through-substrate vias 110 through the conductive features 90. The conductive features 90 may include conductive pads, conductive bumps, conductive pillars, or a combination thereof. The conductive features 90 may be made of aluminum (Al), copper (Cu), tungsten (W), another applicable conductive material, or a combination thereof.

As shown in FIG. 10, the optical sensor structure 10 includes the sensor pixel array 200 in the substrate 100, the light collimating layer 600 on the substrate 100, and the through-substrate vias 110. The sensor pixel array 200 has a plurality of sensor pixels 202. The through-substrate vias 110 extends from the first surface 100A to the opposite second surface 100B' of the substrate 100. The through-substrate vias are in the sensor pixel array 200 and does not vertically overlap with the plurality of sensor pixels 202. In other words, the through-substrate vias are vertically misaligned with the plurality of sensor pixels 202. Disposing the through-substrate vias 110 in the sensor pixel array 200 may further reduce the volume of the optical sensor structure 10 as compare to disposing the through-substrate vias 110 in the periphery region of the sensor pixel array 200, and thus a die gain of the substrate may be increased. Moreover, although the through-substrate vias 110 and the sensor pixels 202 are illustrated adjoining each other in FIG. 10, embodiments of the disclosure are not limited thereto. For example, the through-substrate vias 110 and the sensor pixels 202 may not adjoin each other, such as a width of the through-substrate via 110 may be less than a spacing between the adjacent sensor pixels 202.

In this embodiment, the optical sensor structure 10 further includes the conductive features 90. The conductive features 90 are disposed on the second surface 100B' and connected to the through-substrate vias 110 respectively. The conductive features 90 include conductive pads, conductive bumps, conductive pillars, or a combination thereof.

In this embodiment, the through-substrate via 110 includes the through hole 102', the conductive layer 106 filling in the through hole 102', and the seed layer 104 disposed in the through hole 102' and between the conductive layer 106 and the substrate 100.

In this embodiment, the light collimating layer 600 includes the plurality of transparent pillars 300 disposed on the sensor pixels 202 of the sensor pixel array 200 respectively, and the light shielding layer 400 disposed on the substrate 100 and filling the spaces in between the transparent pillars 300. The transparent pillars 300 can protect the sensor pixels 202 and reduce or prevent contamination or damage to the sensor pixels 202 during the manufacturing process, which may further impact the sensitivity of the optical sensor structure 10. The transparent pillars 300 are made of a transparent material, and the light transmittance of the transparent material to light with a wavelength in a range from 300 nm to 1200 nm is greater than 90%.

In accordance with the above embodiments, when forming a light sensor structure having a light collimating layer, the through-substrate vias (TSV) under the light collimating layer may be utilized to vertically conduct the stacked devices, and the ways in which the signals are transmitted have been changed from horizontally to vertically. Different from the traditional way of routing metal wires through various structural layers in order to connect light sensor structure with other devices, using through-substrate via to vertically conduct the stacked devices may increase device stacking density, decrease volume, and shorten the conductive path, so as to further improve the electrical performance. Moreover, since it is unnecessary to form metal wires, molding compound, and package substrate for encapsulation, the thickness of the structure can be further decreased, and the defect resulted from thermal expansion coefficient mismatch can be reduced.

In addition, a region of the sensor pixel array where no sensor pixel is disposed is further utilized to dispose one or more through-substrate vias in some embodiments of the present disclosure. Disposing the through-substrate vias in the sensor pixel array may further reduce the volume of the optical sensor structure as compare to disposing the through-substrate vias in the periphery region of the sensor pixel array, and thus a die gain of the substrate may be increased.

It should be noted that, although the exemplary embodiments disclosed in the examples described herein relate to a fingerprint sensing device, the technical features provided in the present disclosure can also be utilized in other types of sensors, and are not merely limited to a sensor device for detecting fingerprints. For example, the present disclosure can be utilized in a biosensor, a sensor device relating to medical applications (e.g., detecting heartbeat or blood oxygen level) or radiation research, etc., and it is not limited to the scope disclosed in the embodiments above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor structure, comprising:
   a sensor pixel array in a substrate, wherein the sensor pixel array has a plurality of sensor pixels;
   a light collimating layer on the substrate; and
   at least one through-substrate via extending from a first surface to an opposite second surface of the substrate, wherein the at least one through-substrate via is in the sensor pixel array and is vertically misaligned with the plurality of sensor pixels.

2. The optical sensor structure as claimed in claim 1, further comprising at least one conductive feature disposed on the second surface and connected to the at least one through-substrate via respectively.

3. The optical sensor structure as claimed in claim 2, wherein the at least one conductive feature comprises conductive pads, conductive bumps, conductive pillars, or a combination thereof.

4. The optical sensor structure as claimed in claim 1, wherein the at least one through-substrate via comprises:
   a through hole;
   a conductive layer filling in the through hole; and
   a seed layer disposed in the through hole and between the conductive layer and the substrate.

5. The optical sensor structure as claimed in claim 1, wherein the light collimating layer comprises:
   a plurality of transparent pillars, wherein each of the plurality of transparent pillars is disposed on each of the plurality of sensor pixels of the sensor pixel array correspondingly; and
   a light shielding layer disposed on the substrate and filling spaces in between the transparent pillars.

6. The optical sensor as claimed in claim 5, wherein the plurality of transparent pillars is made of a transparent material, and a light transmittance of the transparent material to light with a wavelength in a range from 300 nm to 1200 nm is greater than 90%.

7. The optical sensor as claimed in claim 5, wherein the light shielding layer is made of photoresist, oil ink, molding compound, solder mask, or a combination thereof.

8. The optical sensor as claimed in claim 5, wherein the light shielding layer comprises metallic materials.

9. The optical sensor as claimed in claim 5, wherein the light collimating layer further comprises a light shielding cap disposed on the light shielding layer.

10. The optical sensor as claimed in claim 9, wherein the light shielding cap is a resin light shielding cap, and a light transmittance of the resin light shielding cap to light with a wavelength in a range from 300 nm to 1200 nm is less than 1%.

11. A method for forming an optical sensor structure, comprising:
    forming at least one through-substrate via in a substrate;
    forming a sensor pixel array in the substrate, wherein the sensor pixel array has a plurality of sensor pixels, and wherein the at least one through-substrate via is in the sensor pixel array and vertically misaligned with the plurality of sensor pixels; and
    forming a light collimating layer on the substrate.

12. The method as claimed in claim 11, further comprising forming at least one conductive feature, wherein the at least one conductive feature connects the at least one through-substrate via respectively.

13. The method as claimed in claim 12, wherein the at least one conductive feature comprises conductive pads, conductive bumps, conductive pillars, or a combination thereof.

14. The method as claimed in claim 11, wherein the at least one through-substrate via comprises:
    a through hole;
    a conductive layer filling in the through hole; and
    a seed layer disposed in the through hole and between the conductive layer and the substrate.

15. The method as claimed in claim 11, wherein forming the at least one through-substrate via comprises performing a planarization process on a bottom surface of the substrate to remove a portion of the substrate, so as to expose a bottom surface of the at least one through-substrate via.

16. The method as claimed in claim 11, wherein the light collimating layer comprises:
    a plurality of transparent pillars, wherein each of the plurality of transparent pillars is disposed on each of the plurality of sensor pixels of the sensor pixel array correspondingly; and
    a light shielding layer disposed on the substrate and filling spaces in between the transparent pillars.

17. The method as claimed in claim 16, wherein the plurality of transparent pillars is made of a transparent material, and a light transmittance of the transparent material to light with a wavelength in a range from 300 nm to 1200 nm is greater than 90%.

18. The method as claimed in claim 16, wherein the light shielding layer is made of photoresist, oil ink, molding compound, solder mask, or a combination thereof.

19. The method as claimed in claim 16, wherein the light shielding layer comprises metallic materials.

20. The method as claimed in claim 16, further comprising disposing a light shielding cap on the light shielding layer, wherein the light shielding cap is a resin light shielding cap, and a light transmittance of the resin light shielding cap to light with a wavelength in a range from 300 nm to 1200 nm is less than 1%.

* * * * *